US012796024B2

(12) United States Patent
Wu et al.

(10) Patent No.: US 12,796,024 B2
(45) Date of Patent: Nov. 10, 2026

(54) NANOWIRE, FABRICATION METHOD OF ARRAY SUBSTRATE HAVING ACTIVATION REGION AND GROWTH REGION WITH DIFFERENT WIDTHS OF GUIDE TRENCHS, ARRAY SUBSTRATE AND ELECTRONIC DEVICE

(71) Applicant: BOE TECHNOLOGY GROUP CO., LTD., Beijing (CN)

(72) Inventors: Hao Wu, Beijing (CN); Feng Guan, Beijing (CN); Yang Lv, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 478 days.

(21) Appl. No.: 18/273,730

(22) PCT Filed: May 24, 2022

(86) PCT No.: PCT/CN2022/094587
§ 371 (c)(1),
(2) Date: Jul. 21, 2023

(87) PCT Pub. No.: WO2023/225831
PCT Pub. Date: Nov. 30, 2023

(65) Prior Publication Data
US 2024/0387631 A1 Nov. 21, 2024

(51) Int. Cl.
*H10D 62/10* (2025.01)
*H10D 30/01* (2025.01)
(Continued)

(52) U.S. Cl.
CPC ......... *H10D 62/121* (2025.01); *H10D 30/031* (2025.01); *H10D 30/6757* (2025.01); *H10W 44/501* (2026.01)

(58) Field of Classification Search
CPC ............... H10D 62/121; H10D 30/031; H10D 30/6757; H10D 30/67; H10D 30/021; H10D 62/10; H10D 62/118; H10W 44/501
(Continued)

(56) References Cited

U.S. PATENT DOCUMENTS

2005/0151061 A1* 7/2005 Ogura .................... B82Y 10/00 250/214.1
2006/0226424 A1* 10/2006 Chae .................. H10D 30/6739 257/E29.151
(Continued)

FOREIGN PATENT DOCUMENTS

CN 111682076 A 9/2020
CN 112018032 A 12/2020
(Continued)

*Primary Examiner* — Mohammad M Hoque
(74) *Attorney, Agent, or Firm* — HOUTTEMAN LAW LLC

(57) ABSTRACT

The present disclosure provides a nanowire, a fabrication method of an array substrate, an array substrate and an electronic device, belongs to the field of semiconductor technology, and can solve the problem of large area of an active region. The fabrication method of the nanowire includes: forming an insulating layer on a first surface of the substrate; forming a trench layer having a guide trench on a surface of the insulating layer away from the substrate, wherein a width of the guide trench is 0.8 to 1.2 times of a diameter of an induction particle having a specified size; forming the induction particle in the guide trench; forming a precipitation layer on a surface of the trench layer away from the substrate; and forming the nanowire by processing the precipitation layer to separate specified atoms out in the precipitation layer along the guide trench under induction of the induction particle.

11 Claims, 9 Drawing Sheets

(51) Int. Cl.
*H10D 30/67* (2025.01)
*H10W 44/00* (2026.01)

(58) Field of Classification Search
USPC .......................................................... 257/288
See application file for complete search history.

(56) References Cited

U.S. PATENT DOCUMENTS

| | | | | |
|---|---|---|---|---|
| 2010/0295022 | A1* | 11/2010 | Chang .................. | H10D 30/014 257/E21.294 |
| 2011/0233512 | A1 | 9/2011 | Yang et al. | |
| 2012/0193798 | A1* | 8/2012 | Zhong ............... | H10W 20/4462 257/E21.585 |
| 2018/0335666 | A1* | 11/2018 | Yoon ................. | G02F 1/133603 |

FOREIGN PATENT DOCUMENTS

| | | | | | |
|---|---|---|---|---|---|
| CN | 112599418 | A | | 4/2021 | |
| CN | 113206015 | A | | 8/2021 | |
| KR | 20100025836 | A | * | 3/2010 | ............. B82Y 40/00 |

* cited by examiner

NANOWIRE, FABRICATION METHOD OF ARRAY SUBSTRATE HAVING ACTIVATION REGION AND GROWTH REGION WITH DIFFERENT WIDTHS OF GUIDE TRENCHS, ARRAY SUBSTRATE AND ELECTRONIC DEVICE

CROSS-REFERENCE TO RELATED APPLICATION

This is a National Phase Application filed under 35 U.S.C. 371 as a national stage of PCT/CN2022/094587, filed on May 24, 2022, the contents of which are incorporated herein in their entirety by reference.

TECHNICAL FIELD

The present disclosure relates to the field of semiconductor technology, and particularly relates to a nanowire, a fabrication method of an array substrate, an array substrate and an electronic device.

BACKGROUND

The silicon nanowire has a wide application prospect in the field of micro-nano electronic devices, photoelectric devices, chemical and biological sensing devices, energy conversion and storage devices and the like. The silicon nanowire is of a one-dimensional nanostructure and has the characteristics such as a remarkable quantum effect, and an ultra-large specific surface area, so that a metal oxide semiconductor (MOS) field effect transistor device which is based on the silicon nanowire has a good gate control capability and a current characteristic. The in-plane solid-liquid-solid (IP-SLS) growth technology is a technology for growing nanowires through metal catalysis, and the silicon-based nanowires formed through this technology have the characteristic similar to single crystal, have high compatibility with a display panel production line, and may be used as a potential application technology for upgrading the production line in the future.

SUMMARY

The present disclosure aims to provide a nanowire, a fabrication method of an array substrate, an array substrate and an electronic device.

In a first aspect, the present disclosure provides a method for fabricating a nanowire, including: forming an insulating layer on a first surface of a substrate; forming a trench layer having a guide trench on a surface of the insulating layer away from the substrate, wherein a width of the guide trench is 0.8 to 1.2 times of a diameter of an induction particle having a specified size: forming the induction particle in the guide trench: forming a precipitation layer on a surface of the trench layer away from the substrate; and forming the nanowire by processing the precipitation layer to separate specified atoms out in the precipitation layer along the guide trench under induction of the induction particle.

The forming the trench layer having the guide trench on the surface of the insulating layer away from the substrate includes: forming a trench dielectric layer on the surface of the insulating layer away from the substrate; and forming the trench layer having the guide trench by processing the trench dielectric layer using an electron beam lithography technology.

The trench layer includes an activation region and a growth region, the trench layer has a plurality of guide trenches including guide trenches in the activation region and guide trenches in the growth region, a pitch of the guide trenches in the activation region is larger than a pitch of the guide trenches in the growth region, and the guide trenches in the activation region are connected to corresponding ones of the guide trenches in the growth region through transition trenches.

The pitch of the guide trenches in the activation region ranges from 0.2 μm to 2 μm; and the pitch of the guide trenches in the growth region ranges from 50 nm to 500 nm.

The activation region include a first activation region and a second activation region, the growth region includes a first growth region and a second growth region, the guide trenches in the first growth region are communicated with the guide trenches in the first activation region, and the guide trenches in the second growth region are communicated with the guide trenches in the second activation region.

A width of each guide trench in the first activation region is greater than a width of each guide trench in the second activation region, a width of each guide trench in the first growth region is the same as a width of each guide trench in the first activation region, and a width of each guide trench in the second growth region is the same as the width of each guide trench in the second activation region.

The guide trenches in the activation region and the growth region are formed by a single process: the induction particles in the guide trenches in the first activation region and the second activation region are formed by a single process; and the nanowires in the first growth region and the second growth region are formed by a single process.

The precipitation layer is made of a material that includes amorphous silicon, forming the nanowire by processing the precipitation layer to separate specified atoms out in the precipitation layer along the guide trench under induction of the induction particle includes: forming a silicon nanowire by annealing the precipitation layer to separate silicon atoms out in the precipitation layer along the guide trench under the induction of the induction particle.

After forming the nanowire by processing the precipitation layer to separate specified atoms out in the precipitation layer along the guide trench under induction of the induction particle, the method further includes: etching a residue of the precipitation layer by a plasma enhanced chemical vapor deposition process using hydrogen plasma; and removing remaining induction particles other than the nanowire by using an etching liquid.

In a second aspect, embodiments of the present disclosure further provide a method for fabricating an array substrate, wherein forming the nanowires is performed by using the method according to the embodiments of the present disclosure.

After forming the nanowires by processing the precipitation layer to separate specified atoms out in the precipitation layer along the guide trench under induction of the induction particle, the method further includes: forming a sacrificial layer on a surface of the trench layer away from the substrate: forming a transition layer on a surface of the sacrificial layer away from the substrate; and forming a first transition electrode and a second transition electrode in the transition layer by patterning the transition layer.

After the patterning the transition layer, the method further includes: forming a first electrode layer on a surface of the transition layer away from the substrate: forming a first electrode and a second electrode in the first electrode layer by patterning the first electrode layer, wherein the first electrode is stacked on the first transition electrode, and the second electrode is stacked on the second transition electrode; and depositing a passivation layer covering exposed surfaces of the nanowires, the first transition electrode, the second transition electrode, the first electrode, and the second electrode.

The substrate includes one of a glass substrate and a silicon substrate.

In a third aspect, the present disclosure further provides an array substrate, including: a substrate including a first surface: an insulating layer on the first surface of the substrate: a trench layer on a surface of the insulating layer away from the substrate, and including a guide trench having a width ranging from 50 nm to 250 nm; and a nanowire layer on the surface of the insulating layer away from the substrate and including a nanowire therein, wherein the nanowire is in the guide trench.

The trench layer includes an activation region and a growth region, the trench layer has a plurality of guide trenches including guide trenches in the activation region and guide trenches in the growth region, a pitch of the guide trenches in the activation region is larger than a pitch of the guide trenches in the growth region, and the guide trenches in the activation region are connected to corresponding ones of the guide trenches in the growth region through transition trenches.

The pitch of the guide trenches in the activation region ranges from 0.2 μm to 2 μm; and the pitch of the guide trenches in the growth region ranges from 50 nm to 500 nm.

The activation region include a first activation region and a second activation region, the growth region includes a first growth region and a second growth region, the guide trenches in the first growth region are communicated with the guide trenches in the first activation region, and the guide trenches in the second growth region are communicated with the guide trenches in the second activation region.

A width of each guide trench in the first activation region is greater than a width of each guide trench in the second activation region, a width of each guide trench in the first growth region is the same as a width of each guide trench in the first activation region, and a width of each guide trench in the second growth region is the same as the width of each guide trench in the second activation region.

The nanowire layer includes a plurality of nanowire groups, each nanowire group includes a plurality of nanowires spaced apart from each other: a pitch of the nanowires of the nanowire groups corresponding to the activation region ranges from 0.2 μm to 2 μm, and a pitch of the nanowires of the nanowire groups corresponding to the growth region ranges from 50 nm to 500 nm.

The nanowires of the nanowire groups corresponding to the first activation region and the first growth region each have a line width ranging from 60 nm to 80 nm, and the nanowires of the nanowire groups corresponding to the second activation region and the second growth region each have a line width ranging from 20 nm to 30 nm.

The array substrate further includes: a first electrode layer on a surface of the nanowire layer away from the substrate, wherein the first electrode layer includes a first electrode electrically coupled to a source electrode region of the nanowires, and a second electrode electrically coupled to a drain electrode region of the nanowires.

The array substrate further includes: a transition layer on a surface of the nanowire layer away from the substrate, wherein the transition layer includes a first transition electrode between the first electrode and the source electrode region of the nanowires, and a second transition electrode between the second electrode and the drain electrode region of the nanowires.

The array substrate further includes: a third electrode between the substrate and the insulating layer.

The array substrate further includes a passivation layer covering exposed surfaces of the trench layer, the nanowire layer, and the first electrode layer.

The array substrate further includes a passivation layer and a third electrode, wherein the passivation layer covers the insulating layer and exposed surfaces of the nanowires; and the third electrode is on a surface of the passivation layer away from the substrate.

In a fourth aspect, embodiments of the present disclosure provide an electronic device including the array substrate according to the embodiments of the present disclosure.

DETAIL DESCRIPTION OF EMBODIMENTS

In order to enable one of ordinary skill in the art to better understand the technical solutions of the present disclosure, the present disclosure will be described in further detail with reference to the accompanying drawings and the specific embodiments.

Unless defined otherwise, technical or scientific terms used herein shall have the ordinary meanings as understood by one of ordinary skill in the art to which the present disclosure belongs. The term "first," "second," or the like used in the present disclosure is not intended to indicate any order, quantity, or importance, but rather is used to distinguish one element from another. Also, the term "a," "an," "the" or similar referent does not denote a limitation of quantity, but rather denote the presence of at least one. The word "comprise", "include", or the like, means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The term "upper", "lower", "left", "right", or the like is used only to indicate relative positional relationship, and when the absolute position of the object being described is changed, the relative positional relationship may also be changed accordingly.

Figure 1:
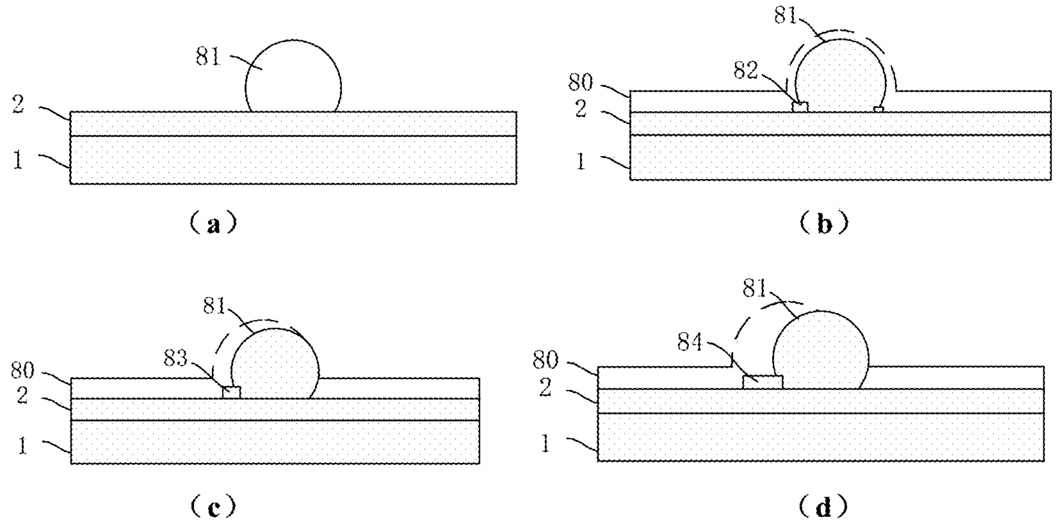
FIG. 1 is a schematic diagram of growing a nanowire by using the IP-SLS technology.

A fabrication method of a nanowire according to an embodiment of the present disclosure is provided on the basis of the IP-SLS technology. FIG. 1 is a schematic diagram of growing a nanowire by using the IP-SLS technology. As shown in FIG. 1, the principle of nanowire growth (growing a nanowire) includes the following Steps S11 to S14.

In Step S11, an insulating layer 2 is formed on a surface of a substrate 1, a catalytic layer is formed on a surface of the insulating layer 2 away from the substrate 1, and in-situ treatment is performed on metal particles to form nanoparticles 81, as shown in (a) of FIG. 1.

In Step S12, a precursor layer 80 is deposited on a surface of the insulating layer 2, and then the substrate is heated to form an alloy droplet 82, such as an indium alloy droplet, at a three-phase interface, as shown in (b) of FIG. 1.

In Step S13, the preset atoms absorbed at an interface of the alloy droplet are transported to an interface between the alloy droplet and the nanowire, and a seed crystal 83 is separated out, as shown in (c) of FIG. 1.

In Step S14, under the drive of gibbs free energy, the seed crystal having the largest size drives the alloy droplet to move in the opposite direction to form a new absorption interface, and finally the nanowire 84 is obtained.

When the array substrate is fabricated, in order to obtain the nanowires in the specified region, a trench layer is formed before the nanowires are formed, a guide trench is formed in the trench layer, and the nanowires are formed in the guide trench. A width of the guide trench influences a width of the nanowire, and thus influences the on-state current and the leakage current of the array substrate, and also influences an area of an active region.

Embodiments of the present disclosure provide a fabrication method of a nanowire, which obtains an ultrafine nanowire by determining a guide trench based on an induction particle having a specified size (particle size), obtaining the induction particle having the specified size in the guide trench, and defining the width of the nanowire by using the width of the guide trench.

Figure 2:
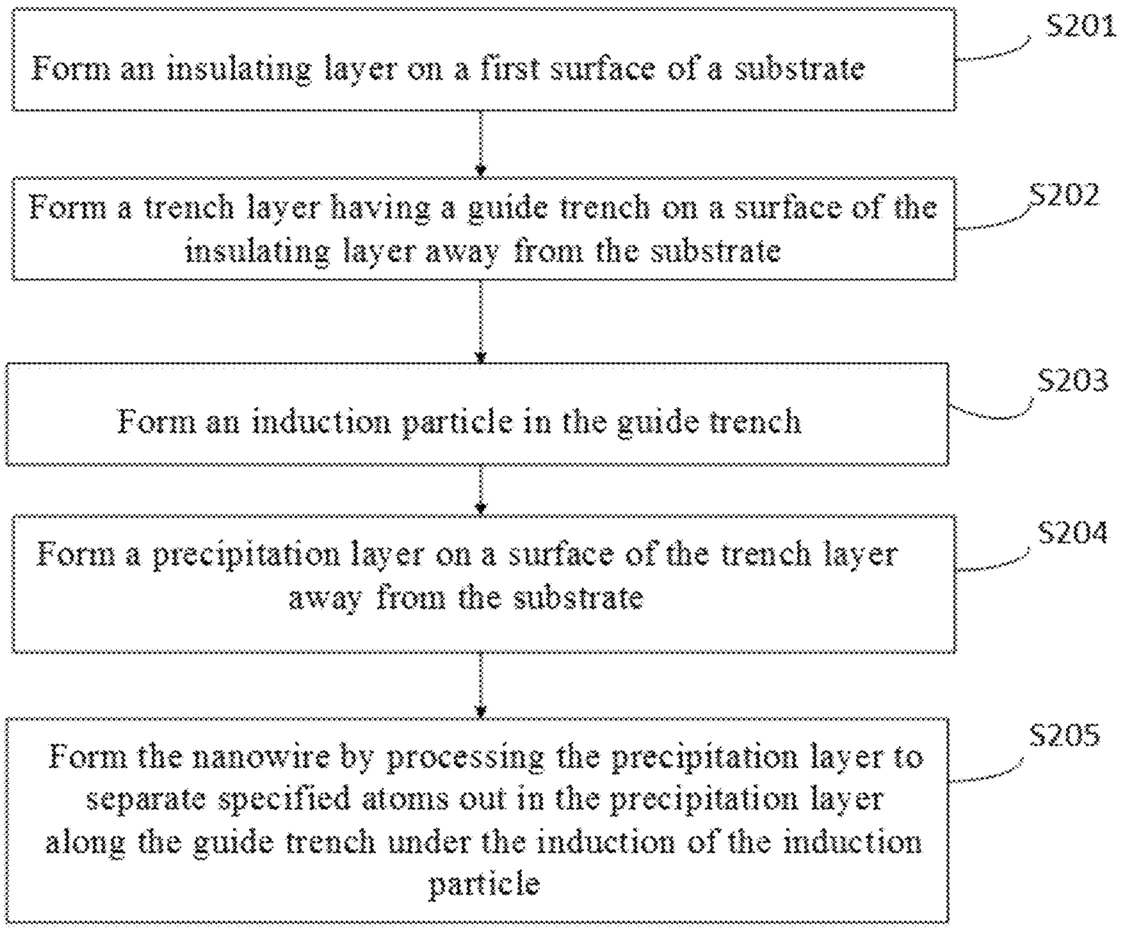
FIG. 2 is a flowchart of a fabrication method of a nanowire according to an embodiment of the present disclosure.

FIG. 2 is a flowchart of a fabrication method of a nanowire according to an embodiment of the present disclosure. As shown in FIG. 2, the fabrication method of the nanowire includes: Steps S201 to S205.

Step S201 includes forming an insulating layer on a first surface of a substrate.

The substrate includes, but is not limited to, a glass substrate and a silicon substrate, and the material for forming the substrate is not limited in the present disclosure. The substrate includes a first surface and a second surface which are opposite to each other, and the first surface and the second surface may be configured to support thin film transistors. For convenience of description, the embodiments of the present disclosure are described by taking the first surface as an example.

In some embodiments, the insulating layer may be made of a material including silicide such as silicon nitride ($SiN_x$), and silicon oxide ($SiO_x$), or an organic material such as polyimide or acrylic.

In some embodiments, the insulating layer may be formed by a deposition process, such as a physical vapor deposition process or a chemical vapor deposition process. A thickness of the insulating layer is not limited in the embodiments of the present disclosure, for example, the thickness of the insulating layer is 3000 angstroms.

Step S202 includes forming a trench layer having a guide trench on a surface of the insulating layer away from the substrate.

A width of each guide trench is 0.8 to 1.2 times of the diameter of each induction particle having a specified size, so that each guide trench may contain only one induction particle having the specified size in a width direction. In the process of forming the nanowire under the induction of the induction particle, the nanowire is constrained by the guide trench to form the nanowire with a size consistent with that of the induction particle with the specified size.

In some embodiments, Step S202 of forming the trench layer having the guide trench on the surface of the insulating layer away from the substrate includes: forming a trench dielectric layer on the surface of the insulating layer away from the substrate; and forming the trench layer having the guide trench by processing the trench dielectric layer using electron beam lithography technology.

The trench dielectric layer may be made of a material including silicide such as silicon nitride ($SiN_x$) and silicon oxide ($SiO_x$), or organic material such as polyimide and acrylic. A thickness of the trench dielectric layer may be in a range from 1000 angstroms to 1500 angstroms, such as 1200 angstroms.

The trench dielectric layer is patterned by using electron beam lithography (E-Beam Lithography, EBL for short) technology, so as to form the trench layer with the guide trench. The ultrafine guide trench (such as a guide trench having a width below 0.5 u m, or a guide trench having a width of 20 nm) may be obtained by the EBL technology. The smaller the width of the guide trench is, the tighter the arrangement of the nanowires to be formed may be, which may reduce the area of the active region of a single array substrate, and thus improve the resolution of the array substrate.

In some embodiments, a plurality of guide trenches are disposed in the trench layer, the plurality of guide trenches are arranged at intervals, a distance between adjacent guide trenches may be set as required, and the distance between adjacent guide trenches is not limited in the embodiments of the present disclosure.

In some embodiments, the widths of the plurality of guide trenches may be all the same or partially the same. Alternatively, a plurality of guide trench groups may be provided according to requirements, and the widths of the guide trenches in each guide trench group are different.

Step S203 includes forming an induction particle in the guide trench.

The principle of fabricating the nanowire by the induction particle may be referred to FIG. 1 and the corresponding description.

In some embodiments, the induction particle may be an indium induction particle (or indium particle), which is obtained by reduction reaction on indium tin oxide. The indium induction particle may also be obtained in other ways. The induction particle may include other elements, as long as the elements capable of promoting the generation of the nanowire may be used as the induction particle.

In some embodiments, the catalytic layer may be made of a material including indium tin oxide, the induction particle includes an indium particle (that is, indium induction particle). The induction particle may be obtained by reduction treatment on the indium tin oxide by a plasma enhanced chemical vapor deposition (PECVD) process using hydrogen plasma.

Step S204 includes forming a precipitation layer on a surface of the trench layer away from the substrate.

The precipitation layer is configured to generate the nanowire, and the material constituting the nanowire is separated out from the precipitation layer under the catalysis of the induction particle.

In some embodiments, the precipitation layer may be formed by a deposition process, such as a physical vapor deposition process or a chemical vapor deposition process. A thickness of the precipitation layer may be in a range from 300 angstroms to 500 angstroms, such as 400 angstroms.

In some embodiments, a material for the precipitation layer may be determined according to the material for the nanowire, for example, the material for the precipitation layer is amorphous silicon.

Step S205 includes forming the nanowire by processing the precipitation layer to separate specified atoms out in the precipitation layer along the guide trench under the induction of the induction particle.

In some embodiments, the nanowire is formed by annealing or the like to separate the specified atoms out from the precipitation layer along the guide trench under the induction of the induction particle.

It should be noted that the width of the nanowire depends on the size (diameter) of the induction particle, and the size of the induction particle may be controlled by controlling the width of the guide trench, so that the width of the nanowire can be precisely controlled. A nanowire having a large diameter has a high carrier mobility, while a nanowire having a small diameter has a low carrier mobility, so that different carrier mobilities may be accurately controlled by accurately controlling the width of the nanowire.

Figure 3:
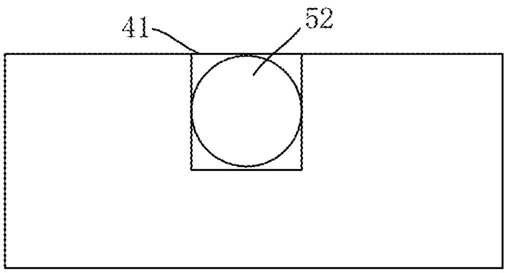
FIG. 3 is a schematic diagram of growing a nanowire with the limitation of both sides of a guide trench according to an embodiment of the present disclosure.
Figure 4:
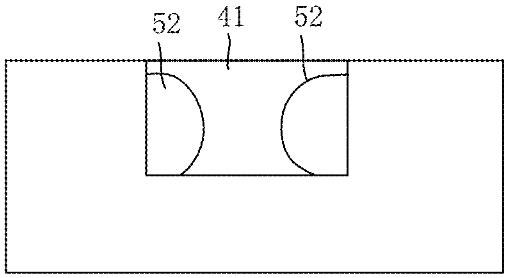
FIG. 4 is a schematic diagram of growing a nanowire with the limitation of a single side of a guide trench according to an embodiment of the present disclosure.

When the width of the guide trench 41 is great, for example, when the width of the guide trench 41 exceeds the size of the induction particle 52, each nanowire may grow along a single sidewall of the guide trench 41, as shown in FIG. 4. When the width of the guide trench 41 is small, the nanowire may grow along both sidewalls of the guide trench by defining the diameter of the induction particle 52 by the width of the guide trench 41, as shown in FIG. 3. The both sidewalls are configured to define the size of the induction particle, and thus may define the width of the nanowire. Thus, when the nanowire is fabricated, the nanowire having the desired diameter may be obtained by determining the width of the guide trench according to the desired diameter of the nanowire.

According to the fabrication method of the nanowire according to the embodiment of the present disclosure, when the trench layer is patterned, the width of the guide trench is determined based on the induction particle having a specified size so as to obtain the induction particle having the specified size in the guide trench, the width of the nanowire is defined by the width of the guide trench so as to obtain the ultrafine nanowire, and thus the densely-arranged nanowires can be obtained, the area of an active region of a single array substrate is reduced, the resolution is improved, the on-state current and the leakage current of the thin film transistor can be controlled, and the performance of the array substrate can be improved.

In some embodiments, Step S203 of forming the induction particle in the guide trench includes: forming a catalytic layer at a preset position; and obtaining the induction particle in the guide trench by performing a treatment on the catalytic layer.

In an embodiment of the present disclosure, each induction particle is generated by using the catalytic layer, and the catalytic layer is made of a material that includes, but is not limited to, indium tin oxide (ITO).

In some embodiments, forming the catalytic layer at the preset position includes: forming the catalytic layer between the insulating layer and the trench layer.

The preset position is between the insulating layer and the trench layer, that is, the catalytic layer is below the trench layer, and after the insulating layer is formed, the catalytic layer is formed on the surface of the insulating layer away from the substrate. A region of the insulating layer covered by the catalytic layer may be set as desired.

In the embodiments of the present disclosure, the catalytic layer is arranged below the trench layer, and the induction particles cannot grow in the region of the catalytic layer covered by the trench layer, so that the induction particles may be generated only in the guide trench, and cannot be generated on the surface of the trench layer away from the substrate, thereby avoiding the generation of disordered nanowires on the surface of the trench layer away from the substrate in the subsequent process, and improving the yield of the nanowires.

Figure 5:
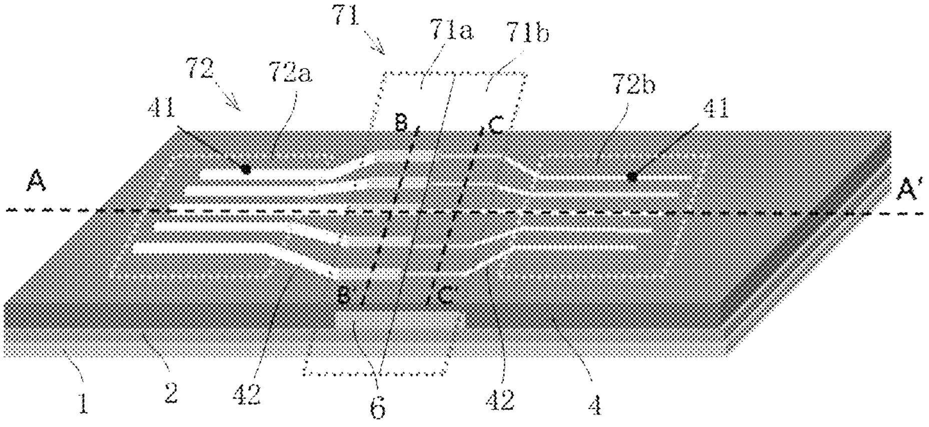
FIG. 5 is a schematic structural diagram of an array substrate after a guide trench is formed according to an embodiment of the present disclosure.

In some embodiments, as shown in FIG. 5, the trench layer 4 includes an activation region 71 and a growth region 72, the activation region 71 corresponds to the position of the catalytic layer 6, the guide trenches 41 in the activation region 71 have a different pitch (here, the pitch refers to a distance between any two adjacent guide trenches) from that for the guide trenches 41 in the growth region 72, and the guide trenches 41 in the activation region 71 are connected to the corresponding ones of the guide trenches 41 in the growth region 72 through transition trenches 42.

In some embodiments, the pitch of the guide trenches 41 in the activation region 71 is greater than the pitch of the guide trenches 41 in the growth region 72, the number of the guide trenches 41 in the activation region 71 is the same as the number of the guide trenches 41 in the growth region 72, and each guide trench 14 extends from the activation region 71 to the growth region 72 through the corresponding transition trench 42.

In the embodiments of the present disclosure, the pitch of the guide trenches in the growth region is smaller than that of the guide trenches in the activation region, so that the area of the growth region can be reduced, the area of the active layer is reduced, and the resolution of the array substrate is improved.

In some embodiments, the pitch of the guide trenches in the activation region is in a range from 0.2 μm to 2 μm; and the pitch of the guide trenches in the growth region is in a range from 50 nm to 500 nm.

In some embodiments, since the pitch of the guide trenches 41 in the activation region 71 is different from the pitch of the guide trenches 41 in the growth region 72, a shape of an orthographic projection of the transition trench 42 on the surface of the insulating layer 2 away from the substrate I may be any one of an arc line and a straight line.

Figure 6:
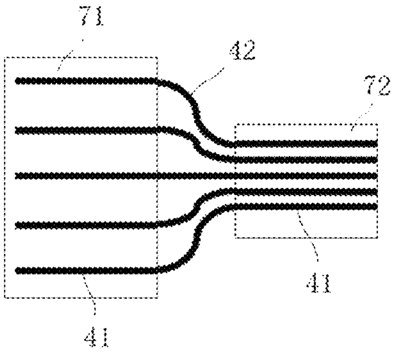
FIG. 6 is a schematic diagram of guide trenches according to an embodiment of the present disclosure.

FIG. 6 is a schematic diagram of guide trenches according to an embodiment of the present disclosure. As shown in FIG. 6, the transition trench 42 has an arc shape, i.e., the guide trench 41 in the activation region 71 is communicated with (connected to) the guide trench 41 in the growth region 72 through the arc-shaped transition trench 42.

Figure 7:
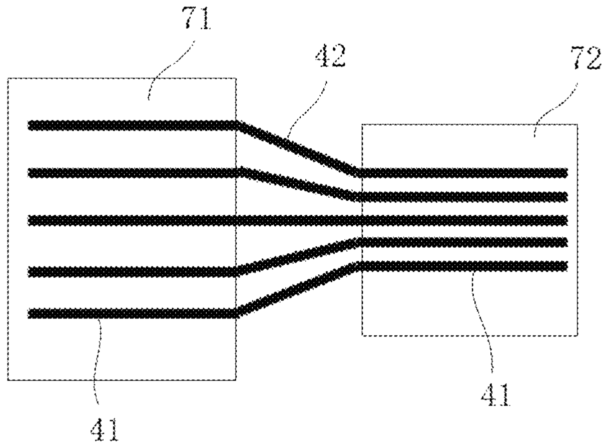
FIG. 7 is a schematic diagram of guide trenches according to another embodiment of the present disclosure.

FIG. 7 is a schematic diagram of guide trenches according to another embodiment of the present disclosure. As shown in FIG. 7, the transition trench 42 has a straight shape, i.e., the guide trench 41 in the activation region 71 is communicated with the guide trench 41 in the growth region 72 through the straight-shaped transition trench 42. As shown in FIG. 5, the activation region 71 includes a first activation region 71*a* and a second activation region 71*b*, the growth region 72 includes a first growth region 72*a* and a second growth region 72*b*, the guide trenches in the first growth region 72*a* are communicated with the guide trenches in the first activation region 71*a*, and the guide trenches in the second growth region 72*b* are communicated with the guide trenches in the second activation region 71*b*.

In some embodiments, the first and second growth regions 72*a* and 72*b* are located on both sides of the activation region 71, respectively, and the guide trenches in the activation region 71 extend toward the first and second growth regions 72*a* and 72*b* and are communicated with the guide trenches in the first and second growth regions 72*a* and 72*b*.

In some embodiments, the width of each guide trench in the first activation region 71*a* is greater than the width of each guide trench in the second activation region 71*b*, the width of each guide trench in the first growth region 72*a* is the same as the width of each guide trench in the first activation region 71*a*, and the width of each guide trench in the second growth region 72*b* is the same as the width of each guide trench in the second activation region 71*b*.

In some embodiments, the width of each guide trench 41 in the first growth region 72*a* is different from the width of each guide trench 41 in the second growth region 72*b*. In some embodiments, the width of each guide trench 41 in the first activation region 71*a* and the first growth region 72*a* is in a range from 60 nm to 80 nm, and the width of each guide trench 41 in the second activation region 71*b* and the second growth region 72*b* is in a range from 20 nm to 30 nm.

In some embodiments, the guide trenches in the activation region 71 and the growth region 72 are formed by a single process, i.e., the trench layer is processed by a single mask process to form the corresponding guide trenches in the activation region 71 and the growth region 72. The fabricating cost of the array substrate can be reduced by forming the guide trenches in the activation region 71 and the growth region 72 through a single process.

In some embodiments, the induction particles in the guide trenches in the first and second activation regions 71*a* and 71*b* are formed by a single process, that is, the induction particles are simultaneously formed in the guide trenches in the first and second activation regions 71*a* and 71*b* when the catalytic layer is reduced. Since the width of each guide trench in the first activation region 71*a* is greater than the width of each guide trench in the second activation region 71*b*, the size of each induction particle formed in the first activation region 71*a* is greater than the size of each induction particle formed in the second activation region 71*b*.

In some embodiments, the precipitation layer is made of a material that includes amorphous silicon (a-Si) or other suitable material.

In some embodiments, Step S205 of forming the nanowire by processing the precipitation layer to separate specified atoms out in the precipitation layer along the guide trench under the induction of the induction particle includes: forming a silicon nanowire by annealing the precipitation layer to separate silicon atoms out in the precipitation layer along the guide trench under the induction of the induction particle.

In some embodiments, when the precipitation layer is annealed, the temperature for annealing may be in a range from 350° C. to 400° C., and the time for annealing may be in a range from 30 min to 60 min. During annealing, silicon atoms in the precipitation layer are separated out along the guide trench under the induction of the induction particle and are converted into crystals from noncrystals, so as to form the silicon nanowire.

In some embodiments, the nanowires in the first and second growth regions 72*a* and 72*b* are formed by a single process, i.e., annealing the precipitation layer, to simultaneously form the nanowires in the first and second growth regions 72*a* and 72*b*.

In some embodiments, after Step S205 of forming the nanowire by processing the precipitation layer to separate specified atoms out in the precipitation layer along the guide trench under the induction of the induction particle, the method includes: removing a residue in the precipitation layer and remaining induction particles other than the nanowire.

By removing the residue in the precipitation layer and the remaining induction particles other than the nanowire, the influence of the residue in the precipitation layer and the remaining induction particles on the connection between the first electrode layer and the nanowires can be avoided, the connection between the electrodes and the nanowires is improved, and the carrier mobility of the nanowires is improved.

In some embodiments, the residue in the precipitation layer is etched by a plasma enhanced chemical vapor deposition process using hydrogen plasma, and the remaining indium particles are removed by an ITO etching solution.

According to the fabrication method of the nanowire according to the embodiment of the present disclosure, when the trench layer is patterned, the width of the guide trench is determined based on the induction particle having a specified size, so that only one induction particle is accommodated in a width direction of the guide trench, the size of the induction particle can be limited, and the overlarge size of the induction particle is avoided. At the same time, two sidewalls of the guide trench are used to limit the growth of nanowires and reduce the line width of nanowires, thus reducing the area of the active region of a single thin film transistor, improving the resolution of the thin film transistor, and reducing the phenomenon of excessive leakage current caused by the hot carrier effect and the short channel effect, thus reducing the power consumption of the transistor, and thus reducing the power consumption of a backplane including the transistor.

Embodiments of the present disclosure provide a fabrication method of an array substrate, which determines a guide trench based on an induction particle having a specified size, so as to obtain the induction particle having the specified size in the guide trench, and defines the width of the nanowire by using the width of the guide trench, so as to obtain an ultrafine nanowire.

Figure 8:
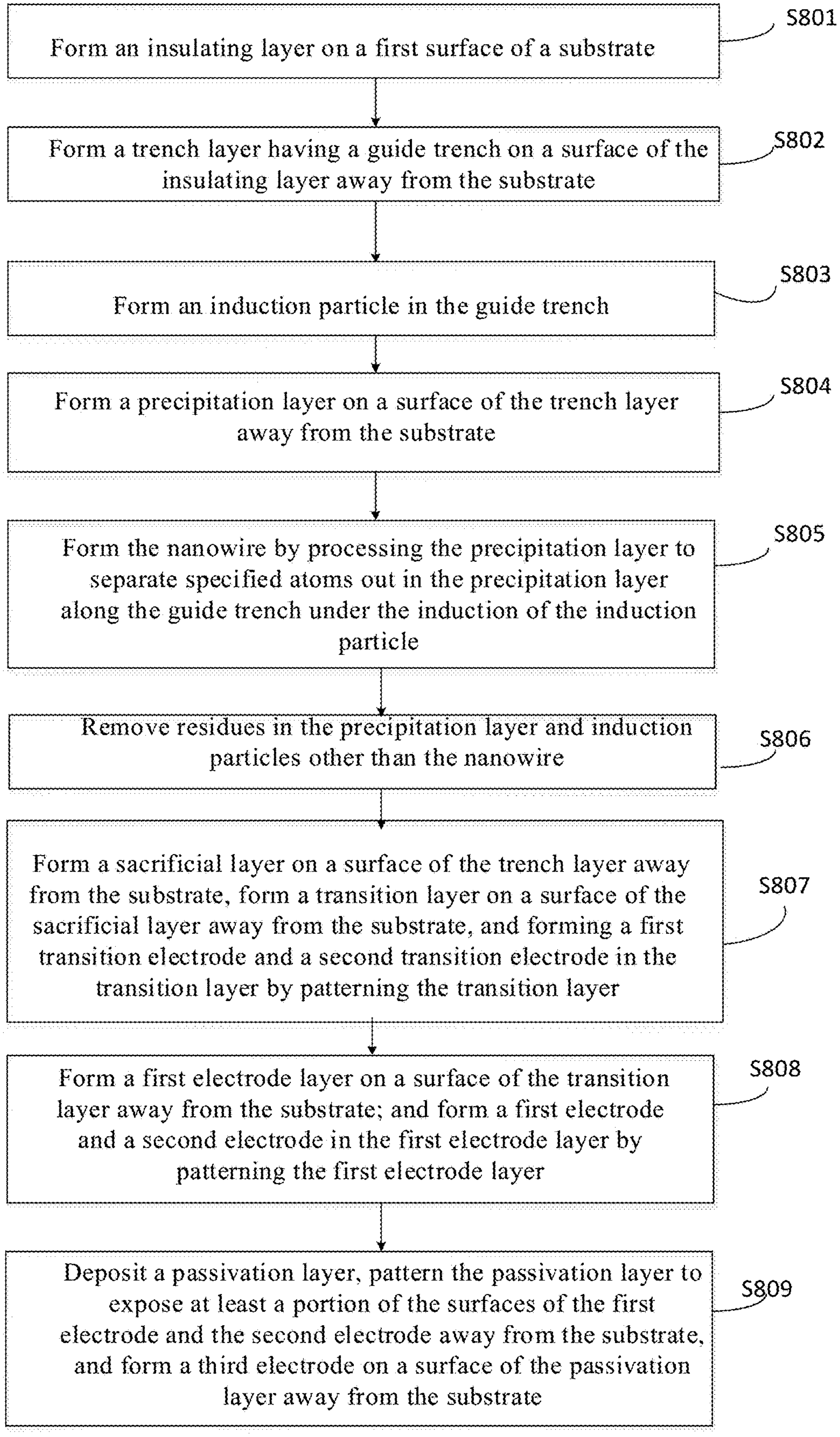
FIG. 8 is a flowchart of a fabrication method of an array substrate according to an embodiment of the present disclosure.

FIG. 8 is a flowchart of a fabrication method of an array substrate according to an embodiment of the present disclosure. As shown in FIG. 8, the method for fabricating an array substrate according to the embodiment of the present disclosure includes S801 to S809.

Step S801 includes forming an insulating layer on a first surface of a substrate.

The substrate includes, but is not limited to, a glass substrate and a silicon substrate, and the material for the substrate is not limited in the present disclosure. The substrate includes a first surface and a second surface which are opposite to each other, and the first surface and the second surface may be configured to support thin film transistors. For convenience of description, the embodiments of the present disclosure are described by taking the first surface as an example.

In some embodiments, the insulating layer may be made of a material including silicide such as silicon nitride ($SiN_x$), and silicon oxide ($SiO_x$), or an organic material such as polyimide or acrylic.

In some embodiments, the insulating layer may be formed by a deposition process, such as a physical vapor deposition process or a chemical vapor deposition process. A thickness of the insulating layer is not limited in the embodiments of the present disclosure, for example, the thickness of the insulating layer is 3000 angstroms.

Step S802 includes forming a trench layer having a guide trench on a surface of the insulating layer away from the substrate.

A width of each guide trench is 0.8 to 1.2 times of the diameter of each induction particle having a specified size, so that each guide trench may contain only one induction particle having the specified size in a width direction. In the process of forming the nanowire under the induction of the induction particle, the nanowire is constrained by the guide trench to form the nanowire with a size consistent with that of the induction particle with the specified size.

In some embodiments, Step S802 of forming the trench layer having the guide trench on the surface of the insulating layer away from the substrate includes: forming a trench dielectric layer on the surface of the insulating layer away from the substrate; and forming the trench layer having the guide trench by processing the trench dielectric layer using electron beam lithography technology.

The trench dielectric layer may be made of a material including silicide such as silicon nitride ($SiN_x$) and silicon oxide ($SiO_x$), or organic material such as polyimide and acrylic. A thickness of the trench dielectric layer may be in a range from 1000 to 1500 angstroms, such as 1200 angstroms.

In some embodiments, the trench dielectric layer is patterned by using electron beam lithography (E-Beam Lithography, EBL for short) technology, so as to form the trench layer with the guide trench. The ultrafine guide trench (such as a guide trench having a width below 0.5 μm, or a guide trench having a width of 20 nm) may be obtained by the EBL technology. The smaller the width of the guide trench is, the tighter the arrangement of the nanowires formed subsequently may be, which may reduce the area of the active region of a single array substrate, and thus improve the resolution of the array substrate.

In some embodiments, a plurality of guide trenches are obtained in the trench dielectric layer by patterning the trench dielectric layer, the plurality of guide trenches may be arranged at intervals, a distance between adjacent guide trenches may be set as required, and the distance between adjacent guide trenches is not limited in the embodiments of the present disclosure.

In some embodiments, the widths of the plurality of guide trenches may be all the same or partially the same. Alternatively, a plurality of guide trench groups may be provided according to requirements, and the widths of the guide trenches in each guide trench group are different.

Step S803 includes forming an induction particle in the guide trench.

In some embodiments, Step S803 of forming an induction particle in the guide trench includes: forming a catalytic layer at a preset position; and obtaining the induction particle in the guide trench by processing the catalytic layer.

In an embodiment of the present disclosure, the induction particle is generated by using the catalytic layer, and the catalytic layer is made of a material that includes, but is not limited to, indium tin oxide (ITO).

In some embodiments, the preset position may be between the insulating layer and the trench layer. Forming the catalytic layer at the preset position includes forming the catalytic layer between the insulating layer and the trench layer. That is, the catalytic layer is below the trench layer, and after the insulating layer is formed, the catalytic layer is formed on the surface of the insulating layer away from the substrate. The region of the insulating layer covered by the catalytic layer may be set as desired.

In the embodiments of the present disclosure, the catalytic layer is arranged below the trench layer, and the induction particles cannot grow in the region of the catalytic layer covered by the trench layer, so that the induction particles can be generated only in the guide trench, and cannot be generated on the surface of the trench layer away from the substrate, thereby avoiding the generation of disordered nanowires on the surface of the trench layer away from the substrate in the subsequent process, and improving the yield of the nanowires.

In some embodiments, the catalytic layer may be made of a material including indium tin oxide, the induction particle includes an indium particle. The induction particle may be obtained by reduction treatment on the indium tin oxide by a plasma enhanced chemical vapor deposition (PECVD) process using hydrogen plasma.

Step S804 includes forming a precipitation layer on a surface of the trench layer away from the substrate.

The precipitation layer is configured to generate the nanowire, and the material constituting the nanowire is separated out from the precipitation layer under the catalysis of the induction particle.

In some embodiments, the precipitation layer may be formed by a deposition process, such as a physical vapor deposition process or a chemical vapor deposition process. A thickness of the deposition layer may be in a range from 300 angstroms to 500 angstroms, such as 400 angstroms.

In some embodiments, a material for the precipitation layer may be determined according to the material for the nanowire, for example, the material for the precipitation layer is amorphous silicon.

In some embodiments, as shown in FIG. 5, the precipitation layer 7 is located on an activation region 71 and a growth region 72, the activation region 71 corresponds to the position of the catalytic layer 6, the guide trenches 41 in the activation region 71 have a different pitch (i.e., the distance between any two adjacent guide trenches) from that for the guide trenches 41 in the growth region 72, and the guide trenches 41 in the activation region 71 are connected to the corresponding ones of the guide trenches 41 in the growth region 72 through transition trenches 42.

In some embodiments, the pitch of the guide trenches 41 in the activation region 71 is greater than the pitch of the guide trenches 41 in the growth region 72, the number of guide trenches 41 in the activation region 71 is the same as the number of guide trenches 41 in the growth region 72, and each guide trench 14 extends from the activation region 71 to the growth region 72 through the corresponding transition trench 42.

In some embodiments, the pitch of the guide trenches in the activation region is in a range from 0.2 μm to 2 μm; and the pitch of the guide trenches in the growth region is in a range from 50 nm to 500 nm.

In some embodiments, since the pitch of the guide trenches 41 in the activation region 71 is different from the pitch of the guide trenches 41 in the growth region 72, a shape of an orthographic projection of the transition trench 42 on the surface of the insulating layer 2 away from the substrate I may be any one of an arc line and a straight line.

As shown in FIG. 5, the activation region 71 includes a first activation region 71*a* and a second activation region 71*b*, the growth region 72 includes a first growth region 72*a* and a second growth region 72*b*, the guide trenches in the first growth region 72*a* are communicated with the guide trenches in the first activation region 71*a*, and the guide trenches in the second growth region 72*b* are communicated with the guide trenches in the second activation region 71*b*.

In some embodiments, the growth region 72 includes a first growth region 72*a* and a second growth region 72*b*, the first growth region 72*a* and the second growth region 72*b* are respectively located on both sides of the activation region 71, and the guide trenches in the activation region 71 extend toward the first growth region 72*a* and the second growth region 72*b* and are communicated with the guide trenches in the first growth region 72*a* and the second growth region 72*b*.

In some embodiments, the width of each guide trench in the first activation region 71*a* is greater than the width of each guide trench in the second activation region 71*b*, the width of each guide trench in the first growth region 72*a* is the same as the width of each guide trench in the first activation region 71*a*, and the width of each guide trench in the second growth region 72*b* is the same as the width of each guide trench in the second activation region 71*b*.

In some embodiments, the width of each guide trench 41 in the first growth region 72*a* is different from the width of each guide trench 41 in the second growth region 72*b*. In some embodiments, the width of each guide trench 41 in the first activation region 71*a* and the first growth region 72*a* is in a range from 60 nm to 80 nm, and the width of each guide trench 41 in the second activation region 71*b* and the second growth region 72*b* is in a range from 20 nm to 30 nm.

In some embodiments, the guide trenches in the activation region 71 and the growth region 72 are formed by a single process, i.e., the trench layer is processed by a single mask process to form the corresponding guide trenches in the activation region 71 and the growth region 72. The fabricating cost of the array substrate can be reduced by forming the guide trenches in the activation region 71 and the growth region 72 through a single process.

In some embodiments, the induction particles in the guide trenches in the first and second activation regions 71*a* and 71*b* are formed by a single process, that is, the induction particles are simultaneously formed in the guide trenches of the first and second activation regions 71*a* and 71*b* when the catalytic layer is reduced. Since the width of each guide trench in the first activation region 71*a* is greater than the width of each guide trench in the second activation region 71*b*, the size of each induction particle formed in the first activation region 71*a* is greater than the size of each induction particle formed in the second activation region 71*b*.

In some embodiments, the precipitation layer is made of a material that includes amorphous silicon (a-Si) or other suitable material.

Step S805 includes forming the nanowire by processing the precipitation layer to separate specified atoms out in the precipitation layer along the guide trench under the induction of the induction particle.

In some embodiments, the nanowire is formed by a process such as annealing to separate the specified atoms out in the precipitation layer along the guide trench under the induction of the induction particle. The nanowire may serve as the active layer of the transistor for a conductive channel. The width of the nanowire depends on the size (diameter) of the induction particle. By controlling the width of the guide trench, the size of the induction particle can be controlled, thereby precisely controlling the width of the nanowire. A nanowire having a large diameter has a high carrier mobility, while a nanowire having a small diameter has a low carrier mobility, so that various carrier mobilities may be accurately controlled by accurately controlling the width of the nanowire.

In some embodiments, the nanowires in the first and second growth regions 72*a* and 72*b* are formed by a single process, i.e., annealing the precipitation layer, to simultaneously form the nanowires in the first and second growth regions 72*a* and 72*b*.

In some embodiments, Step S805 of forming the nanowire by processing the precipitation layer to separate specified atoms out in the precipitation layer along the guide trench under the induction of the induction particle includes: forming the silicon nanowire by annealing the precipitation layer to separate silicon atoms out in the precipitation layer along the guide trench under the induction of the induction particles.

In some embodiments, when the precipitation layer is annealed, the temperature for annealing may be in a range from 350° C. to 400° C., and the time for annealing may be in a range from 30 min to 60 min. During annealing, silicon atoms in the precipitation layer are separated out along the guide trench under the induction of the induction particles and are converted into crystals from noncrystals, so as to form the silicon nanowire.

In some embodiments, after Step S805 of forming the nanowire by processing the precipitation layer to separate specified atoms out in the precipitation layer along the guide trench under the induction of the induction particles, the method includes: Step S806 of removing a residue in the precipitation layer and remaining induction particles other than the nanowire.

By removing the residue in the precipitation layer and the remaining induction particles other than the nanowires, the influence of the residue in the precipitation layer and the remaining induction particles on the connection between the first electrode layer and the nanowires can be avoided, the connection between the electrodes and the nanowires is improved, and the carrier mobility of the nanowires is improved.

In some embodiments, the residue in the precipitation layer is etched by a plasma enhanced chemical vapor deposition process using hydrogen plasma, and the remaining indium particles are removed by an ITO etching solution.

Step S807 includes forming a sacrificial layer on a surface of the trench layer away from the substrate, forming a transition layer on a surface of the sacrificial layer away from the substrate, and forming a first transition electrode and a second transition electrode in the transition layer by patterning the transition layer.

In some embodiments, the sacrificial layer may be made of a material including amorphous silicon and may have a thickness ranging from 300 angstroms to 500 angstroms. The embodiments of the present disclosure do not limit the fabrication method of the sacrificial layer, for example, the sacrificial layer may be formed by a deposition process.

In some embodiments, the transition layer may be made of a material including N+amorphous silicon, and may have a thickness ranging from 500 Å to 1000 Å. The fabrication method of the transition layer is not limited in the embodiments of the present disclosure, for example, the transition layer may be formed by a deposition process.

In the embodiment of the present disclosure, the sacrificial layer is disposed between the transition layer and the nanowire, which may prevent the leakage current from being increased due to damage to the nanowire during patterning the transition layer.

In some embodiments, after Step S807 of patterning the transition layer, the fabrication method further includes Step S808.

Step S808 includes forming a first electrode layer on a surface of the transition layer away from the substrate; and forming a first electrode and a second electrode in the first electrode layer by patterning the first electrode layer. The first electrode is stacked on the first transition electrode, and the second electrode is stacked on the second transition electrode.

The first electrode layer is made of a material that includes at least one of conductive metals such as molybdenum, copper, aluminum, etc., and a thickness of the first electrode layer is 2000 angstroms or more, for example, the thickness of the first electrode layer is 2200 angstroms. The method for forming the first electrode layer is not limited in the embodiments of the present disclosure, and for example, the first electrode layer is formed by a physical vapor deposition process.

In some embodiments, the first electrode layer is patterned by a coating, exposing, and developing processes to obtain the first electrode and the second electrode. The first electrode may be a drain electrode of the thin film transistor, and the second electrode may be a source electrode of the thin film transistor. Alternatively, the first electrode may be a source electrode of the thin film transistor, and the second electrode may be a drain electrode of the thin film transistor.

In the embodiments of the present disclosure, since the first electrode is stacked on the first transition electrode, that is, the first transition electrode is disposed between the first electrode and the nanowire, and the first transition electrode forms an ohmic contact with the nanowire, which can reduce a contact resistance between the first electrode and the nanowire, and improve the characteristics of the thin film transistor. Similarly, the second electrode is stacked on the second transition electrode, that is, the second transition electrode is disposed between the second electrode and the nanowire, and the second transition electrode forms an ohmic contact with the nanowire, which can reduce a contact resistance between the second electrode and the nanowire, and improve the characteristics of the thin film transistor.

In some embodiments, after patterning the first electrode layer to obtain the first electrode and the second electrode, the fabrication method further includes Step S809.

Step S809 includes depositing a passivation layer, patterning the passivation layer to expose at least a portion of the surfaces of the first electrode and the second electrode away from the substrate, and forming a third electrode on a surface of the passivation layer away from the substrate. The passivation layer covers the exposed surfaces of the nanowire, the first transition electrode, the second transition electrode, the first electrode, and the second electrode.

The passivation layer may be made of a material that includes, but is not limited to, silicon oxide ($SiO_x$) and silicon nitride ($SiN_x$). A thickness of the passivation layer is not limited in the embodiments of the present disclosure, as long as the passivation layer may cover the conductive layer, for example, the thickness of the passivation layer may be 800 angstroms or 400 angstroms. The fabrication method of the passivation layer is not limited in the embodiments of the present disclosure, for example, the passivation layer may be formed by deposition and other processes.

In some embodiments, after depositing the passivation layer, the method further includes the follow steps.

In some embodiments, the passivation layer may be patterned by coating, exposing, and developing processes to expose at least portions of the surfaces of the first and second electrodes away from the substrate.

The third electrode may be made of a material that includes a conductive metal, such as molybdenum or copper. A thickness of the third electrode is not limited in the embodiments of the present disclosure, and for example, the thickness of the third electrode is 500 angstroms or 2200 angstroms.

In some embodiments, the third electrode may serve as a gate electrode of the thin film transistor, and the first electrode, the second electrode, and the third electrode constitute the transistor. Since the gate electrode is on top of the passivation layer, the thin film transistor may be referred to as a transistor having a top-gate structure.

In some embodiments, in a case where the thin film transistor has a bottom-gate structure, before forming the insulating layer on the first surface of the substrate in Step S801, the fabrication method further includes: forming a third electrode of the transistor on the first surface of the substrate, that is, the third electrode is between the substrate and the insulating layer. At this time, the passivation layer covers the exposed surfaces of the trench layer, the nanowire layer, and the first electrode layer.

The third electrode serves as the gate electrode of the transistor, the third electrode may be made of a conductive metal such as molybdenum or copper, and the thickness of the third electrode may be 500 angstroms or 2200 angstroms. The thickness of the third electrode is not limited in the embodiments of the present disclosure.

According to the fabrication method of the array substrate according to the embodiment of the present disclosure, when the trench layer is patterned, the width of the guide trench is determined based on the induction particle having a specified size, so that only one induction particle is accommodated in a width direction of the guide trench, the size of the induction particle can be limited, and the overlarge size of the induction particle is avoided. At the same time, two sidewalls of the guide trench are used to limit the growth of nanowires and reduce the line width of nanowires, thus reducing the area of the active region of a single thin film transistor, improving the resolution of the thin film transistor, and reducing the phenomenon of excessive leakage current caused by the hot carrier effect and the short channel effect, thus reducing the power consumption of the transistor, and thus reducing the power consumption of a backplane including the transistor.

An embodiment of the present disclosure further provides an array substrate, the nanowires of the array substrate define the width of the nanowires through the guide trenches, so as to obtain ultrafine nanowires, so that the resolution of the array substrate is improved.

Figure 9:
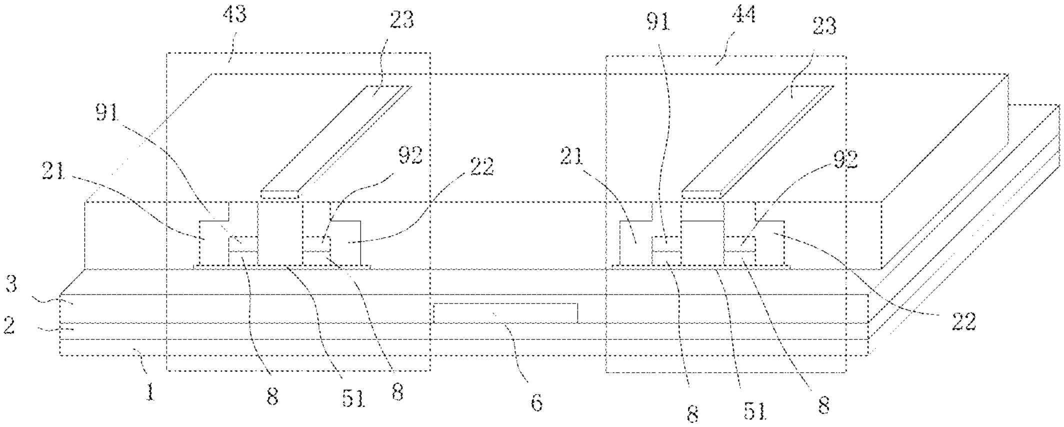
FIG. 9 is a schematic structural diagram of an array substrate according to an embodiment of the present disclosure.
Figure 10:
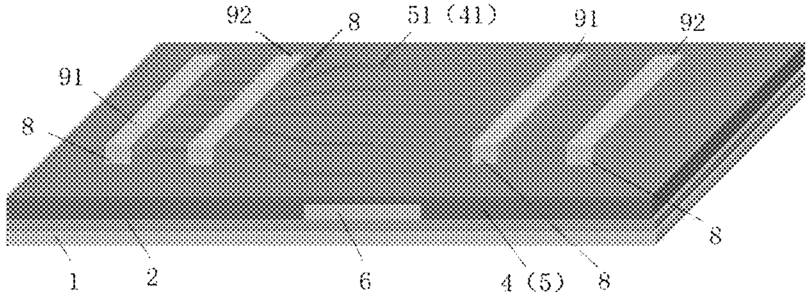
FIG. 10 is a schematic diagram of a partial structure of an array substrate according to an embodiment of the present disclosure.

FIG. 9 is a schematic structural diagram of an array substrate according to an embodiment of the present disclosure, and FIG. 10 is a schematic diagram of a partial structure of an array substrate according to an embodiment of the present disclosure. As shown in FIGS. 9 and 10, the array substrate includes the following components.

The array substrate includes a substrate 1, and the substrate includes a first surface.

The substrate includes, but is not limited to, a glass substrate and a silicon substrate, and the material for the substrate is not limited in the present disclosure. The substrate includes a first surface and a second surface opposite to each other, and the first surface and the second surface may be configured to support various components of the electronic device.

The array substrate further includes an insulating layer 2 on the first surface of the substrate 1.

In some embodiments, the insulating layer 2 may be made of a material including silicide such as silicon nitride ($SiN_x$), and silicon oxide ($SiO_x$), or an organic material such as polyimide or acrylic, and the thickness of the insulating layer is not limited in the embodiments of the present disclosure.

The array substrate further includes a trench layer 4 on a surface of the insulating layer away from the substrate, guide trenches are provided in the trench layer 4, and the width of each guide trench is in a range from 50 nm to 250 nm.

In some embodiments, the trench layer 4 includes an activation region 71 and a growth region 72, a pitch of the guide trenches in the activation region 71 is greater than a pitch of the guide trenches in the growth region 72, and the guide trenches of the activation region 71 are connected to corresponding ones of the guide trenches in the growth region 72 through the corresponding transition trenches 42.

In some embodiments, the pitch of the guide trenches in the activation region is in a range from 0.2 μm to 2 μm; and the pitch of the guide trenches in the growth region is in a range from 50 nm to 500 nm.

In some embodiments, the activation region 71 include a first activation region 71*a* and a second activation region 71*b*: the growth region 72 includes a first growth region 72*a* and a second growth region 72*b*, the guide trench in the first growth region 72*a* is communicated with the guide trench in the first activation region 71*a*, and the guide trench in the second growth region 72*b* is communicated with the guide trench in the second activation region 71*b*.

In some embodiments, the width of each guide trench in the first activation region 71*a* is greater than the width of each guide trench in the second activation region 71*b*, the width of each guide trench in the first growth region 72*a* is the same as the width of each guide trench in the first activation region 71*a*, and the width of the guide trench in the second growth region 72*b* is the same as the width of each guide trench in the second activation region 71*b*.

In some embodiments, the trench layer 4 may be made of a material that includes silicon oxide, silicon nitride, etc., and the thickness of the trench layer 4 is in a range from 1000 angstroms to 1500 angstroms. One or more guide trenches may be provided as required.

The array substrate further includes a nanowire layer 5 on a surface of the insulating layer 2 away from the substrate 1, and the nanowire layer 5 includes nanowires 51 in the guide trenches 41.

In some embodiments, the nanowire layer 5 includes a plurality of nanowire groups, each nanowire group includes a plurality of nanowires spaced apart from each other: a pitch of the nanowires in the nanowire group corresponding to the activation region is in a range from 0.2 μm to 2 μm, and a pitch of the nanowires in the nanowire group corresponding to the growth region is in a range from 50 nm to 500 nm.

In an embodiment of the present disclosure, a line width of the nanowires in the nanowire groups corresponding to the first activation region and the first growth region is in a range from 60 nm to 80 nm, and a line width of the nanowires in the nanowire groups corresponding to the second activation region and the second growth region is in a range from 20 nm to 30 nm.

In some embodiments, the array substrate further includes a first electrode layer stacked on a surface of the nanowire layer away from the substrate. A first electrode disposed in the first electrode layer is electrically coupled to a source region of the nanowire, and a second electrode disposed in the first electrode layer is electrically coupled to a drain region of the nanowire.

In some embodiments, the first electrode layer may be made of a conductive metal material, for example, the material for the first electrode layer 4 includes at least one of molybdenum, copper, and aluminum. The first electrode 21 and the second electrode 22 may respectively serve as a source electrode and a drain electrode of the transistor.

In some embodiments, the array substrate further includes a transition layer, and the transition layer is disposed on a surface of the nanowire layer away from the substrate. A first transition electrode 91 disposed in the transition layer is stacked between the first electrode 21 and the source region of the nanowire 51, and a second transition electrode 92 disposed in the transition layer is stacked between the second electrode 22 and the drain region of the nanowire 51.

In some embodiments, the first and second transition electrodes 91 and 92 are made of a material including N' type amorphous silicon (N+a-Si).

In some embodiments, the first transition electrode 91 is disposed between the first electrode 21 and the source region of the nanowire 51, and the second transition electrode 92 is disposed between the second electrode 22 and the drain region of the nanowire 51. The first transition electrode 91 is provided, which can improve the abnormal connection between the first electrode 21 and the nanowire 51, reduce the contact barrier of metal-semiconductor contact, enhance the tunneling effect at the interface, and reduce the phenomenon of a large resistance of the array substrate.

In some embodiments, the array substrate further includes: a third electrode 23 between the substrate and the insulating layer.

The third electrode 23 may serve as a gate electrode of a thin film transistor, and the first electrode 21, the second electrode 22, and the third electrode 23 constitute the thin film transistor. Since the third electrode 23 is disposed at the bottom of the thin film transistor, i.e., the gate electrode is disposed at the bottom of the thin film transistor, the thin film transistor may be referred to as a transistor having a bottom-gate structure.

In some embodiments, the array substrate further includes a passivation layer 11 covering exposed surfaces of the trench layer, the nanowire layer, and the first electrode layer. The passivation layer 11 may protect the insulating layer 2, the first electrode layer 10 and the nanowires 51, so as to improve the service life of the array substrate.

In other embodiments, the array substrate further includes a passivation layer 11 and the third electrode 23, the passivation layer 11 covers the insulating layer 2 and the exposed surfaces of the nanowires 51, and the third electrode 23 is on the surface of the passivation layer 11 away from the substrate 1. Since the third electrode is disposed on top of the array substrate, i.e., the gate electrode is on top of the passivation layer, the array substrate may be referred to as an array substrate including a transistor having a top-gate structure.

In the array substrate according to the embodiment of the present disclosure, the width of the guide trench is determined based on the induction particle having a specified size, so that only one induction particle is accommodated in a width direction of the guide trench, and the overlarge size of the induction particle is avoided. At the same time, two sidewalls of the guide trench are used to limit the growth of nanowires and reduce the line width of nanowires, thus reducing the area of the active region of a single array substrate, improving the resolution of the array substrate, and reducing the phenomenon of excessive leakage current caused by the hot carrier effect and the short channel effect, thus reducing the power consumption of the transistor, and thus reducing the power consumption of a backplane including the transistor.

For better understanding of the array substrate and the fabrication method thereof according to the present disclosure, the following description is made with reference to FIG. 11 to FIG. 22, and by taking the array substrate including the transistor having a top-gate structure as an example.

Figure 11:
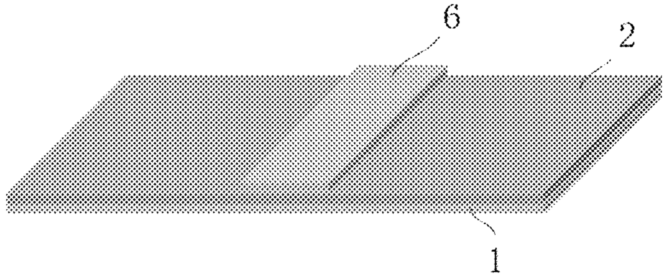
FIG. 11 is a schematic structural diagram after Step S1101 according to an embodiment of the present disclosure.

In Step S1101, an insulating layer 2 is formed on a substrate 1, then a catalytic layer 6 is formed on a surface of the insulating layer 2 away from the substrate 1, and then the catalytic layer 6 is patterned, as shown in FIG. 11.

In Step S1101, a glass substrate is used as the substrate 1, the insulating layer 2 is made of a material that includes silicon nitride ($SiN_x$), a thickness of the insulating layer 2 is 3000 angstroms, and the insulating layer 2 may be formed on the substrate 1 by a deposition process. The catalytic layer 6 may be made of a material that includes indium tin oxide, and a thickness of the catalytic layer 6 is in a range from 150 angstroms to 400 angstroms. The catalytic layer 6 may be formed by a deposition process on the surface of the insulating layer away from substrate 1, and the catalytic layer 6 is patterned by coating, exposure, and development processes. In the embodiments of the present disclosure, the indium tin oxide corresponds to the activation region.

Figure 12:
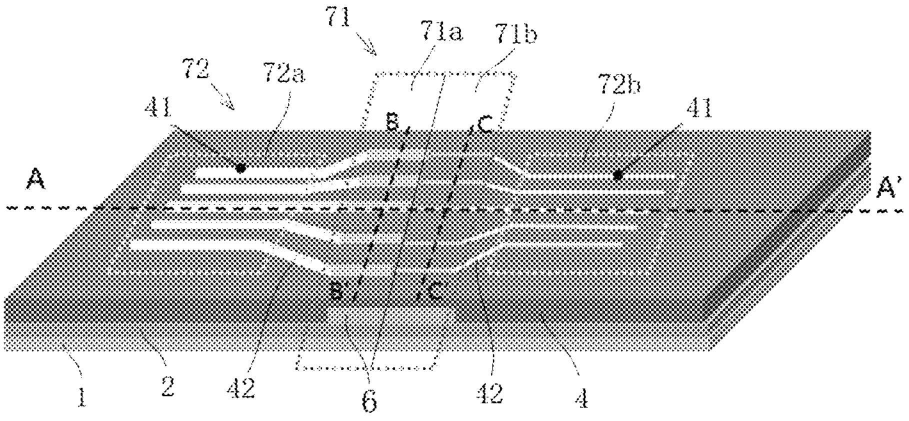
FIG. 12 is a schematic structural diagram after Step S1102 according to an embodiment of the present disclosure.

In Step S1102, a trench layer 4 is formed, and guide trenches 41 penetrating through the trench layer 4 in the thickness direction of the trench layer 4 are formed in the trench layer 4 by using the EBL technology, so that the catalytic layer is exposed at the bottom of the guide trenches 41, as shown in FIG. 12.

The pitch of the guide trenches in the activation region 71 is relatively large, and the pitch of the guide trenches in the growth region 72 is relatively small. For example, the pitch of the guide trenches in the activation region 71 is in a range from 0.2 μm to 2 μm, and the pitch of the guide trenches in the growth region 72 is in a range from 50 nm to 500 nm.

In the embodiments of the present disclosure, the width of the guide trench 41 is determined based on the width of the nanowire to be formed. After the width of the guide trench 41 is determined, the diameter of the induction particle is determined, and the width of the nanowire is determined.

In some embodiments, the width of the guide trench in the first growth region 43 is in a range from 60 nm to 80 nm, and the width of the guide trench in the second growth region 44 is in a range from 20 nm to 30 nm, i.e., the guide trench in the first growth region 43 is a wide guide trench, and the guide trench in the second growth region 44 is a narrow trench. The first growth region 43 corresponds to a DTFT (discrete-time fourier transform) region, and the second growth region 44 corresponds to an STFT (short-time fourier transform) region.

Figure 13:
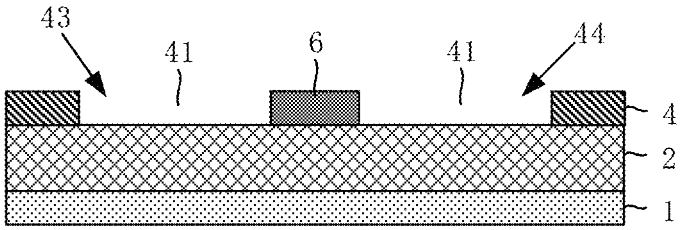
FIG. 13 is a cross-sectional view taken along a line A-A' of FIG. 12 according to an embodiment of the present disclosure.
Figure 14:
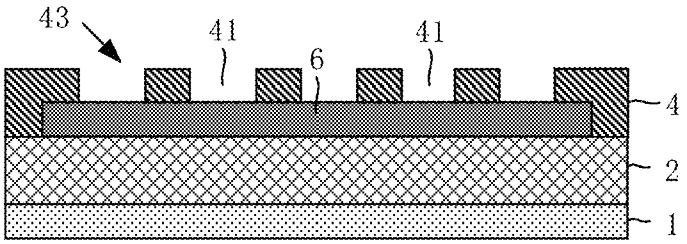
FIG. 14 is a cross-sectional view taken along a line B-B' of FIG. 12 according to an embodiment of the present disclosure.
Figure 15:
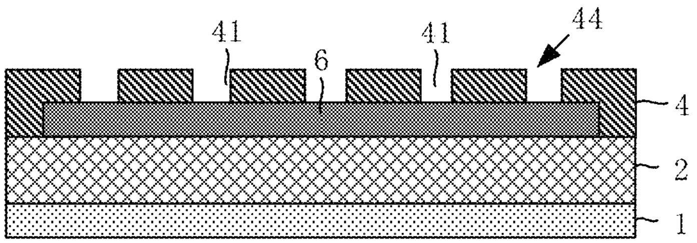
FIG. 15 is a cross-sectional view taken along a line C-C' of FIG. 12 according to an embodiment of the present disclosure.

FIG. 13 is a cross-sectional view taken along a line A-A' in FIG. 12 according to an embodiment of the present disclosure. As shown in FIG. 13, the depth of the guide trench 41 in the first growth region 43 and the depth of the guide trench 41 in the second growth region 44 are both the same as the thickness of the trench layer 4. FIG. 14 is a cross-sectional view taken along a line B-B' in FIG. 12 according to an embodiment of the present disclosure, and FIG. 15 is a cross-sectional view taken along a line C-C' in FIG. 12 according to an embodiment of the present disclosure. As shown in FIGS. 14 and 15, the width of the guide trench 41 in the first growth region 43 is relatively large, and the width of the guide trench 41 in the second growth region 44 is relatively small. In the activation region 71, the catalytic layer 6 is on the bottom of the guide trench.

Figure 16:
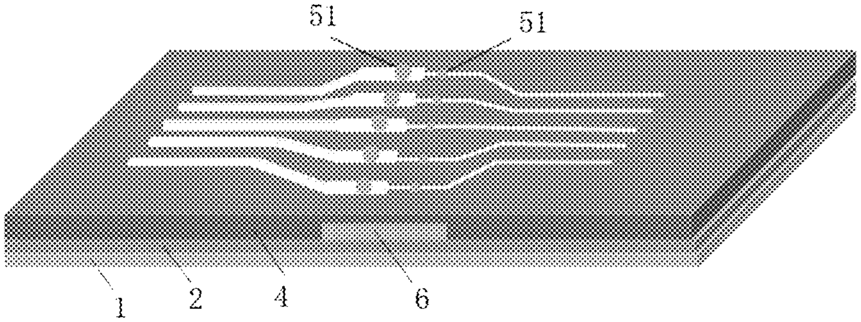
FIG. 16 is a schematic structural diagram after Step S1103 according to an embodiment of the present disclosure.

In Step S1103, induction particles are obtained in the guide trenches by processing the activation region, as shown in FIG. 16.

In Step S1103, the activation region is made of indium tin oxide, and the indium induction particles 52 are obtained by performing a reduction process on the indium tin oxide by a plasma enhanced chemical vapor deposition (PECVD) process using hydrogen plasma (H plasma). Because the catalytic layer 6 is below the trench layer 4, in the reduction process, the indium induction particles 52 are generated only in the guide trenches, and the indium induction particles 52 are not generated on the surface of the trench layer 4 away from the substrate 1, thereby preventing the nanowire from being generated on the surface of the trench layer 4 away from the substrate 1 in the subsequent fabrication process for the nanowire.

In Step S1103, there are guide trenches with two different widths in the activation region. The diameters of the induction particles generated by the guide trenches with different widths are different, the induction particles with a larger size are formed in the wider guide trenches, and the induction particles with a smaller size are formed in the narrower guide trenches.

Specifically, the activation region 71 includes a first activation region 71*a* and a second activation region 71*b*: the growth region 72 includes a first growth region 72*a* and a second growth region 72*b*, the guide trenches in the first growth region 72*a* are communicated with the guide trenches in the first activation region 71*a*, and the guide trenches in the second growth region 72*b* are communicated with the guide trenches in the second activation region 71*b*. The width of each guide trench in the first activation region 71*a* is greater than the width of each guide trench in the second activation region 71*b*, the width of each guide trench in the first growth region 72*a* is the same as the width of each guide trench in the first activation region 71*a*, and the width of each guide trench in the second growth region 72*b* is the same as the width of each guide trench in the second activation region 71*b*.

Figure 17:
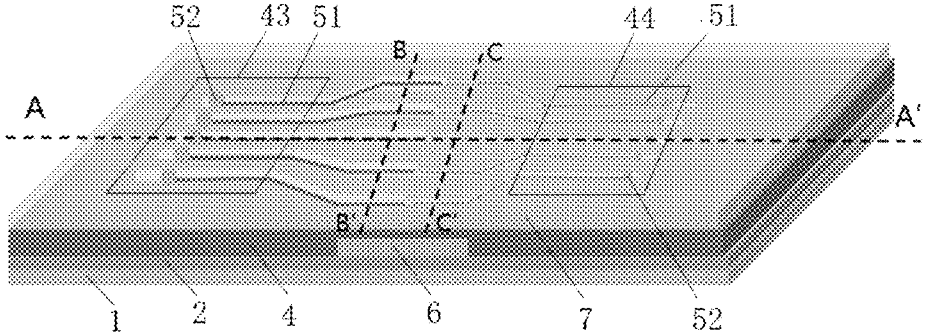
FIG. 17 is a schematic structural diagram after Step S1104 according to an embodiment of the present disclosure.

Step S1104 includes forming a precipitation layer 7 on a surface of the trench layer 6 away from the substrate 1, and processing the precipitation layer 7, so that silicon atoms in the precipitation layer 7 are separated out along the guide trenches under the induction of the induction particles 52, thereby forming a silicon nanowire, as shown in FIG. 17.

In Step S1104, amorphous silicon is formed on the surface of the trench layer away from the substrate by a deposition process, the thickness of the amorphous silicon may be in a range from 300 angstroms to 500 angstroms. Then, the amorphous silicon is annealed at 390° C. for 30 minutes to 60 minutes, such that the silicon atoms are separated out along the guide trenches 41 under the induction of the indium induction particles so as to form the silicon nanowire.

In the embodiments of the present disclosure, the guide trenches with two different widths are present in the activation region, and thus two types of induction particles with different sizes are generated. During the annealing process, nanowires with different widths are formed by using the different induction particles under the constraint of the both sidewalls of the corresponding guide trenches. For example, a nanowire with a larger width, such as a nanowire with a width of 60 nm, is formed in the first growth region 43; and a nanowire with a smaller width, such as a nanowire with a width of 30 nm, is formed in the second growth region 44.

Figure 18:
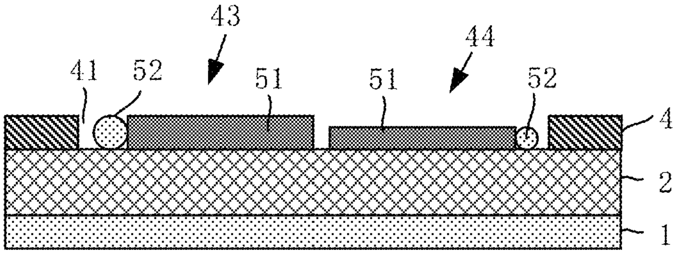
FIG. 18 is a cross-sectional view taken along a line A-A' of FIG. 17 according to an embodiment of the present disclosure.
Figure 19:
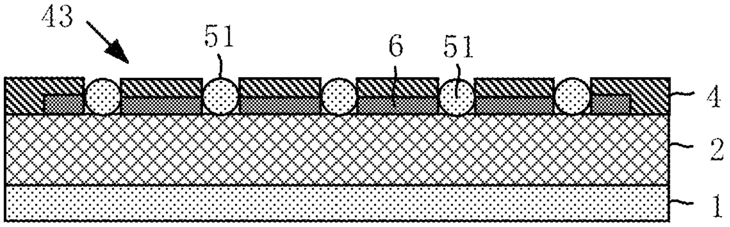
FIG. 19 is a cross-sectional view taken along a line B-B' of FIG. 17 according to an embodiment of the present disclosure.
Figure 20:
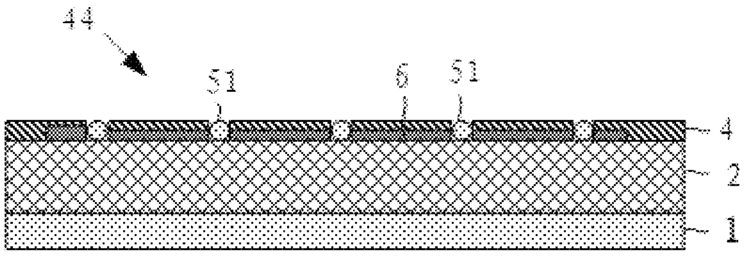
FIG. 20 is a cross-sectional view taken along a line C-C' of FIG. 17 according to an embodiment of the present disclosure.

FIG. 18 is a cross-sectional view taken along a line A-A' in FIG. 17 according to an embodiment of the present disclosure. As shown in FIG. 18, the line width of the silicon nanowire formed in the guide trench 41 in the first growth region 43 is relatively large, and the line width of the silicon nanowire formed in the guide trench 41 in the second growth region 44 is relatively small. FIG. 19 is a cross-sectional view taken along a line B-B' in FIG. 17 according to an embodiment of the present disclosure, and FIG. 20 is a cross-sectional view taken along a line C-C' in FIG. 17 according to an embodiment of the present disclosure. As shown in FIGS. 19 and 20, the nanowire in the guide trench 41 in the first growth region 43 is against both sidewalls of the guide trench 41 in the first growth region 43, and the nanowire in the guide trench 41 in the second growth region 44 is adhered to both sidewalls of the guide trench 41 in the second growth region 44.

Figure 21:
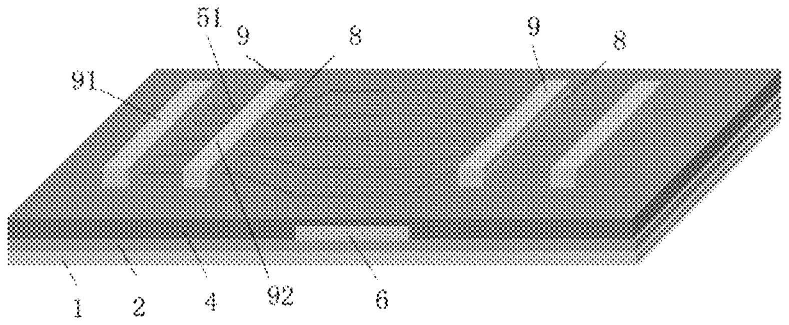
FIG. 21 is a schematic structural diagram after Step S1105 according to an embodiment of the present disclosure.

Step S1105 includes removing a residue of the precipitation layer and the remaining induction particles other than the nanowires, then sequentially forming a sacrificial layer and a transition layer on a surface of the trench layer away from the substrate, and then patterning the sacrificial layer and the transition layer, as shown in FIG. 21.

In Step S1105, the residue in the precipitation layer is etched by a plasma enhanced chemical vapor deposition process using hydrogen plasma. The remaining indium induction particles are removed by an ITO etching solution. The sacrificial layer 8 and the transition layer 9 are formed in sequence by a deposition process on the surface of the trench layer 4 away from the substrate 1. The sacrificial layer 8 may be made of amorphous silicon and have a thickness ranging from 300 angstroms to 500 angstroms. The transition layer 9 may be made of $N^+$ amorphous silicon, and the thickness of the transition layer is in a range from 500 Å to 1000 Å.

In order to reduce the fabrication cost of the array substrate, the sacrificial layer 8 and the transition layer 9 are patterned by using the same mask process, so as to obtain a first transition electrode 91 and a second transition electrode 92 in the transition layer 9.

Since the sacrificial layer 8 is disposed between the nanowire 51 and the transition layer 9, the probability of damaging the nanowire 51 when etching the transition layer 9 is reduced. The transition layer 9 serves as a transition layer for connecting the electrode of the thin film transistor to the nanowire, so that the contact resistance can be reduced, and the characteristics of the thin film transistor can be improved.

Figure 22:
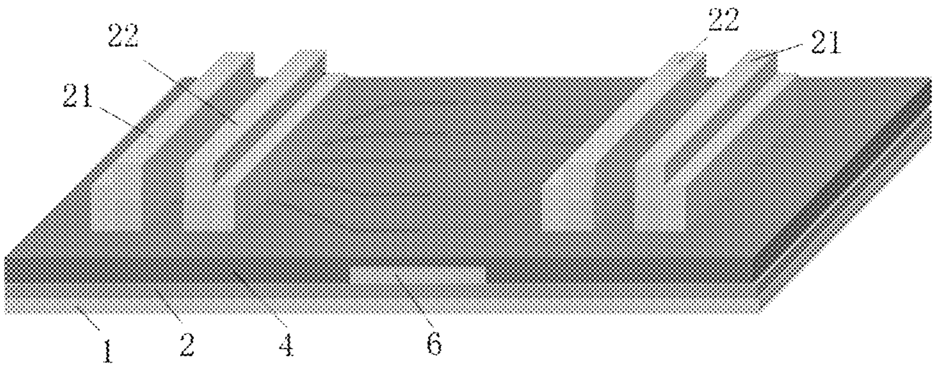
FIG. 22 is a schematic structural diagram after Step S1106 according to an embodiment of the present disclosure.

Step S1106 includes forming a first electrode layer on a surface of the transition layer away from the substrate, and patterning the first electrode layer, as shown in FIG. 22.

In Step S1106, the first electrode layer 10 is formed on the surface of the transition layer 9 away from the substrate 1, then the first electrode layer 10 is patterned, and a first electrode 21 and a second electrode 22 are obtained from the first electrode layer 10.

In Step S1106, the first electrode layer 10 may be made of a material that includes at least one of conductive metals such as molybdenum, copper, and aluminum, and the thickness of the first electrode layer is 2200 angstroms.

Step S1107 includes depositing a passivation layer, forming a second electrode layer on a surface of the passivation layer away from the substrate, and patterning the second electrode layer to obtain a third electrode, as shown in FIG. 9.

In Step S1107, the passivation layer 11 may be made of a material that includes, but is not limited to, silicon oxide ($SiO_x$) and silicon nitride ($SiN_x$), and the passivation layer 11 covers the exposed surfaces of the nanowire, the first transition electrode, the second transition electrode, the first electrode and the second electrode, and is configured to protect the exposed surfaces of the nanowire, the first transition electrode, the second transition electrode, the first electrode and the second electrode, so as to improve the lifetime of the thin film transistor.

In Step S1107, the passivation layer 11 may have a thickness of 800 angstroms or 400 angstroms, and the second electrode layer may be made of a conductive metal such as molybdenum, copper, or aluminum, and may have a thickness of 3100 angstroms. The third electrode serves as a gate electrode of the thin film transistor.

Through the above Steps S1101 to S1107, a transistor having a top-gate structure is obtained.

It is to be understood that the above embodiments are merely exemplary embodiments adopted to illustrate the principles of the present disclosure, but the present disclosure is not limited thereto. It will be apparent to one of ordinary skill in the art that various modifications and improvements can be made without departing from the spirit and scope of the present disclosure, and such modifications and improvements are also considered to be within the scope of the present disclosure.

What is claimed is:

1. An array substrate, comprising:

a substrate comprising a first surface;

an insulating layer on the first surface of the substrate;

a trench layer on a surface of the insulating layer away from the substrate, and comprising a guide trench having a width ranging from 50 nm to 250 nm; and a nanowire layer on the surface of the insulating layer away from the substrate and comprising a nanowire therein, wherein the nanowire is in the guide trench, wherein the trench layer comprises an activation region and a growth region, the activation region comprises a first activation region and a second activation region, the growth region comprises a first growth region and a second growth region, the guide trenches in the first growth region are communicated with the guide trenches in the first activation region, and the guide trenches in the second growth region are communicated with the guide trenches in the second activation region; and a width of each guide trench in the first activation region is greater than a width of each guide trench in the second activation region, a width of each guide trench in the first growth region is the same as a width of each guide trench in the first activation region, and a width of each guide trench in the second growth region is the same as the width of each guide trench in the second activation region.

2. The array substrate of claim 1, wherein the trench layer has a plurality of guide trenches comprising guide trenches in the activation region and guide trenches in the growth region, a pitch of the guide trenches in the activation region is larger than a pitch of the guide trenches in the growth region, and the guide trenches in the activation region are connected to corresponding ones in the growth region through transition trenches.

3. The array substrate of claim 2, wherein the pitch of the guide trenches in the activation region ranges from 0.2 μm to 2 μm; and the pitch of the guide trenches in the growth region ranges from 50 nm to 500 nm.

4. The array substrate of claim 1, wherein the nanowire layer comprises a plurality of nanowire groups, each nanowire group comprises a plurality of nanowires spaced apart from each other; a pitch of the nanowires of the nanowire groups corresponding to the activation region ranges from 0.2 μm to 2 μm, and a pitch of the nanowires of the nanowire groups corresponding to the growth region ranges from 50 nm to 500 nm.

5. The array substrate of claim 4, wherein the nanowires of the nanowire groups corresponding to the first activation region and the first growth region each have a line width ranging from 60 nm to 80 nm, and the nanowires of the nanowire groups corresponding to the second activation region and the second growth region each have a line width ranging from 20 nm to 30 nm.

6. The array substrate of claim 1, further comprising: a first electrode layer on a surface of the nanowire layer away from the substrate, wherein the first electrode layer comprises a first electrode electrically coupled to a source region of the nanowires, and a second electrode electrically coupled to a drain region of the nanowires.

7. The array substrate of claim 6, further comprising: a transition layer on a surface of the nanowire layer away from the substrate, wherein the transition layer comprises a first transition electrode between the first electrode and the source electrode region of the nanowires, and a second transition electrode between the second electrode and the drain electrode region of the nanowires.

8. The array substrate of claim 7, further comprising: a third electrode between the substrate and the insulating layer.

9. The array substrate of claim 8, further comprising a passivation layer covering exposed surfaces of the trench layer, the nanowire layer, and the first electrode layer.

10. The array substrate of claim 1, further comprising a passivation layer and a third electrode, wherein the passivation layer covers the insulating layer and exposed surfaces of the nanowires; and the third electrode is on a surface of the passivation layer away from the substrate.

11. An electronic device, comprising the array substrate of claim 1.

* * * * *